(12) United States Patent
Kong

(10) Patent No.: US 6,211,704 B1
(45) Date of Patent: Apr. 3, 2001

(54) ASYNCHRONOUS SENSING DIFFERENTIAL LOGIC (ASDL) CIRCUIT

(75) Inventor: Bai-Sun Kong, Seoul (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/371,836

(22) Filed: Aug. 11, 1999

Related U.S. Application Data

(63) Continuation-in-part of application No. 08/950,973, filed on Oct. 15, 1997, now Pat. No. 6,028,453, which is a continuation-in-part of application No. 08/688,881, filed on Jul. 31, 1996, now Pat. No. 5,859,548, which is a continuation-in-part of application No. 09/234,517, filed on Jan. 21, 1999, now Pat. No. 6,016,065, which is a division of application No. 08/775,951, filed on Jan. 3, 1997, now Pat. No. 5,903,169.
(60) Provisional application No. 60/022,565, filed on Jul. 24, 1996.

(30) Foreign Application Priority Data

Sep. 1, 1998 (KR) .................................................. 98-35876

(51) Int. Cl.[7] .................................................. A03K 19/096
(52) U.S. Cl. .............................................. 326/121; 326/93
(58) Field of Search ................................ 326/93–98, 112, 326/119, 121

(56) References Cited

U.S. PATENT DOCUMENTS

| | | | |
|---|---|---|---|
| 5,329,176 | * | 7/1994 | Miller, Jr. et al. ..................... 326/93 |
| 5,513,132 | * | 4/1996 | Williams .......................... 364/715.01 |
| 5,565,798 | * | 10/1996 | Durham et al. ........................ 326/93 |
| 5,729,159 | * | 3/1998 | Gersbach ............................... 327/52 |
| 5,777,491 | * | 7/1998 | Hwang et al. ....................... 326/121 |

* cited by examiner

*Primary Examiner*—Michael Tokar
*Assistant Examiner*—Don Phu Le
(74) *Attorney, Agent, or Firm*—Fleshner & Kim, LLP

(57) ABSTRACT

An asynchronous sensing differential logic circuit using a charge-recycling technique includes a control block carrying out a logical operation on a request signal from a preceding stage and a request signal for a succeeding stage, and outputting a first or second input enable signal and a first or second clock signal, a functional block carrying out an operation on an input data according to the first or second input enable signals and the first or second clock signals from the control block, and outputting a first or second output enable signal and an output data, and a latch block triggered by an acknowledge signal from the succeeding stage, and outputting a request signal for the succeeding stage and a final output data by carrying out an operation on the first or second output enable signals and the output data from the functional block.

21 Claims, 8 Drawing Sheets

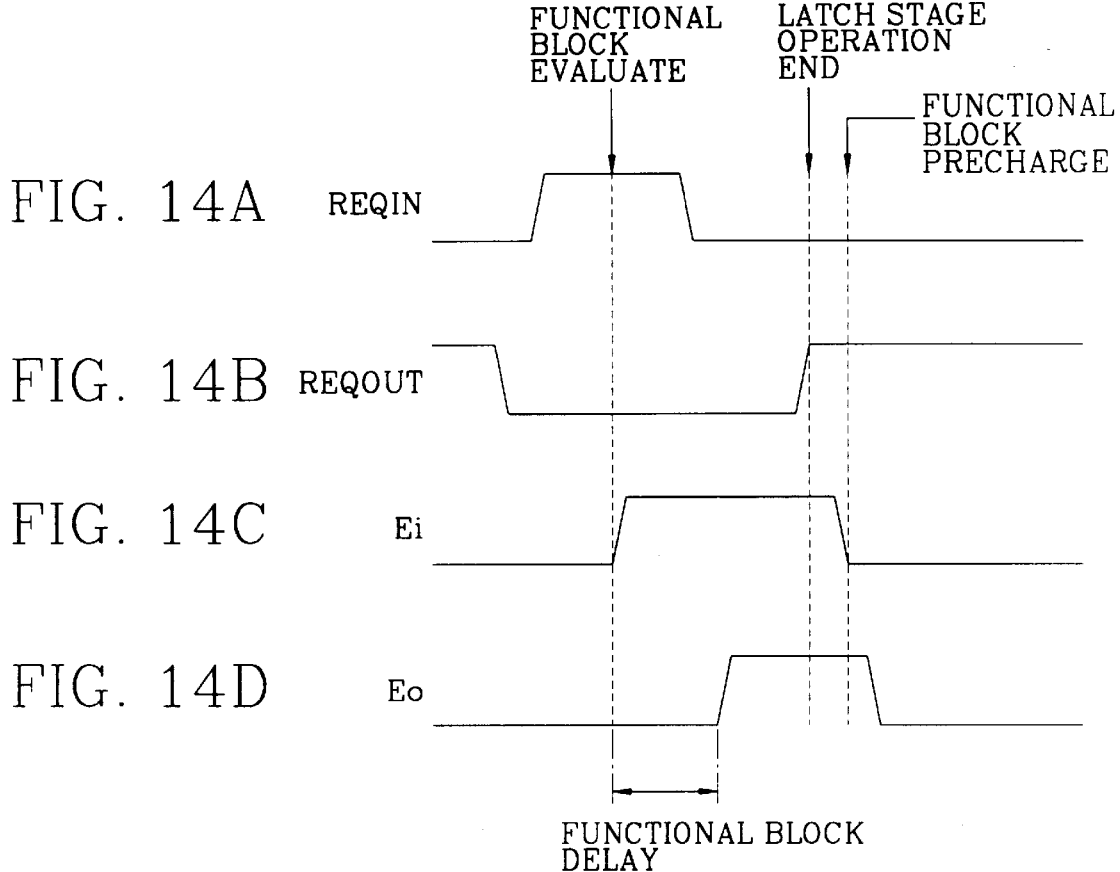

ASYNCHRONOUS SENSING DIFFERENTIAL LOGIC (ASDL) CIRCUIT

This is a continuation-in-part (CIP) application of application Ser. No. 08/950,973 filed Oct. 15, 1997, now U.S. Pat. No. 6,028,453, which is a CIP application of application Ser. No. 08/688,881 filed Jul. 31, 1996, now U.S. Pat. No. 5,859,548 issued Jan. 12, 1999, which claims the benefit of U.S. Provisional Application No. 60/022,565 filed Jul. 24, 1996; and this application is also a CIP application of application Ser. No. 09/234,517 filed Jan. 21, 1999, now U.S. Pat. No. 6,016,065, which is a divisional of application Ser. No. 08/775,951 filed Jan. 3, 1997, now U.S. Pat. No. 5,903,169 issued May 11, 1999, which claims the benefit of U.S. Provisional Application No. 60/022,565 filed Jul. 24, 1996, the entire disclose of previous provisional and non-provisional applications being incorporated herein by reference thereof.

BACKGROUND OF THE INVENTION

1. Field of the Invention

The present invention relates to asynchronous or synchronous circuit, and in particular to an asynchronous sensing differential logic (ASDL) circuit employing a charge-recycling technique.

2. Background of the Related Art

In general, in designing a semiconductor circuit, an asynchronous design technique has advantages in that a clock skew is not generated and a clock signal distribution overhead is not incurred because a global clock signal is not employed, power consumption may be reduced because a signal transition is generated only when there is an event, and latency is decreased because the processing time is determined not by a worst-case delay but by an average delay.

In order to embody an asynchronous system, a smooth communication is required between local function blocks. Here, a 2-phase handshaking protocol or 4-phase handshaking protocol is mainly used. Especially, the 4-phase handshaking protocol is easily embodied in a circuit, and thus is popularly used.

FIG. 1 is a schematic block diagram illustrating a conventional asynchronous pipeline configuration including a functional block 102 performing each logic operation, a completion detector 103 communicating operation completion of the functional block 102, a control block 101 controlling handshaking of the functional block 102, and a latch block 104 outputting data according to the operation of the functional block 102.

A differential cascode voltage switch (DCVS) logic can easily carry out a completion detection from a preceding stage, are mainly utilized as the functional block 102. A circuit diagram thereof is illustrated in FIG. 2.

FIG. 2 is a schematic circuit diagram illustrating a differential cascode voltage switch (DCVS) logic circuit. As shown therein, a clock signal CK is applied to gates of two PMOS transistors PM1, PM2 to the sources of which is applied a power supply voltage Vdd. The clock signal CK is applied to the gate of an NMOS transistor NM1 having its source grounded. The drains of the PMOS transistors PM1, PM2 are commonly connected to the drain of the NMOS transistor NM1 through a cascode logic 102-1 that is turned on/off pursuant to input data. The output drain terminals of the PMOS transistors PM1, PM2 and the cascode logic 102-1 are each respectively connected to the input terminals of two inverters X1, X2. The inverters X1, X2 output respective output signals OUT, $\overline{\text{OUT}}$.

On the other hand, a Muller C-element is often employed as a handshaking circuit in the asynchronous system because of its delay-insensitive property. When two input values are the same, an output value is identical to the input value. In case the two input values are different, an operation of holding a preceding value is carried out.

The control block 101 in the configuration of FIG. 1 is embodied mainly with the Muller C-element for handshaking control.

In addition, the latch block 104 may use a traditional flow-latch type or Muller C-element. However, the flow-latch does not have the delay-insensitive property, and thus the Muller C-element is mostly employed.

As illustrated in FIG. 3, in the latch block 104, an acknowledge signal Ack from the succeeding stage is commonly applied to a gate of a PMOS transistor PM22 to the source of which is applied the power supply voltage Vdd, and to the gate of an NMOS transistor NM22 having its source grounded, and the input signal (Din, namely OUT or $\overline{\text{OUT}}$) is commonly applied to the gate of a PMOS transistor PM21 having its source connected to the drain of the PMOS transistor PM22, and to a gate of an NMOS transistor NM21 with its source connected to the drain of the NMOS transistor NM22. The latch block 104 includes two circuits with a latch 104-1 consisting of two inverters X4, X5 connected in reverse parallel to latch a signal outputted from a node of the PMOS transistor PM21 and the NMOS transistor NM21, and to output the latched signal DATAOUT.

In general, the completion detector 103 in the configuration in FIG. 1 includes a NAND gate or NOR gate to carry out a logic operation on the two output signals OUT, $\overline{\text{OUT}}$ from the functional block 102 and to generate the operation completion signal.

The operation of the conventional asynchronous system will now be described.

When an acknowledge signal ACKOUT from the succeeding stage is low, if a request signal REQIN from the preceding stage is low, the clock signal CK outputted from the control block 101 becomes high, the functional block 102 provides the output value OUT, $\overline{\text{OUT}}$, and the completion detector 103 performing a logic operation on the output value OUT, $\overline{\text{OUT}}$ generates a high output value.

In the case that the output value from the completion detector 103 is high, the output value is transmitted as the request signal REQOUT for the succeeding stage, and as the acknowledge signal ACKIN for the preceding stage.

Then, when the request signal REQIN from the preceding stage is high, the output signal from the control block 101 maintains its preceding output state. When the acknowledge signal ACKOUT from the succeeding stage is high, the clock signal CK outputted from the control block 101 becomes low.

Accordingly, the output signal from the completion detector 103 is generated low, thus rendering low the values of the acknowledge signal ACKIN transmitted to the preceding stage and the request signal REQOUT transmitted to the succeeding stage.

That is, the logic operation of the functional block 102 is carried out by repeating the above-described process.

If functional block 102 is implemented by FIG. 2, when the clock signal CK is low, the PMOS transistors PM1, PM2 are turned on, and thus the internal output terminal, namely the input terminals of the inverters X1, X2 are charged at a high level. The inverters X1, X2 receiving the high signals from the internal output terminals respectively discharge the external output terminals OUT, $\overline{OUT}$ to a low level.

Thereafter, when the clock signal is changed from low to high, the NMOS transistor NM1 is turned on, and thus the cascode logic 102-1 is put into an operational state.

Here, the cascode logic 102-1 discharges the internal output terminal, namely one of the input terminals of the inverters X1, X2 to a low level according to the input value DATAIN. Here, it is presumed for example that the input terminal of the inverter X1 is discharged.

As a result, the output terminal OUT of the inverter X1 whose input terminal is discharged to a low level becomes high, and the output terminal $\overline{OUT}$ of the inverter X2 whose input terminal is charged to a high level is maintained at a low level.

Then, when the clock signal CK is changed from high to low, the data operation is carried out by repeating the above-described process.

When outputted from the functional block 102 constituted as illustrated in FIG. 2, the data OUT, $\overline{OUT}$ are transmitted into the succeeding stage through the latch block 104 including the two circuits consisting of the plurality of transistors PM21, PM22, NM21, NM22 and the latch 104-1 as depicted in FIG. 3.

The operation will now be explained by exemplifying the output data signal OUT from the function block 102. When the acknowledge signal ACKOUT from the succeeding stage is at a low level, if the output data signal OUT from the functional block 102 is at a low level, only the PMOS transistors PM21, PM22 are turned on, the power supply voltage is applied to the latch 104-1, and thus the latch 104-1 outputs the low level data signal DATAOUT. When the acknowledge signal ACKOUT is at a high level, only the NMOS transistors NM21, NM22 are turned on, and thus the input terminal of the latch 104-1 is grounded. As a result, the latch 104-1 outputs the high level data signal DATAOUT.

When the acknowledge signal ACKOUT is at a low level, if the output data signed OUT from the functional block 102 is at a high level, or when the acknowledge signal ACKOUT is at a high level, if the output data signal OUT from the functional block 102 is at a low level, the latch 104-1 maintains a preceding output level until the two input signal levels become identical.

The conventional technique guarantees the low power consumption and high-speed operation in theory. Actually, there is a disadvantage in that performance is not remarkably improved, as compared with a synchronous system, due to a control circuit overhead required for the handshaking protocol and excessive power consumption of the DCVS logic used as the functional block.

SUMMARY OF THE INVENTION

It is therefore an object of the present invention to provide an asynchronous sensing differential logic (ASDL) circuit which can reduce power consumption by applying a charge-recycling technique to an asynchronous system.

In order to achieve the above-described object of the present invention, in an asynchronous system including a control block, a functional block, a completion detector and a latch block, the functional block is provided with a completion detection function, thereby eliminating the need for a conventional completion detector and achieving a low-power operation.

That is, an asynchronous pipeline configuration according to the present invention includes: a control block carrying out a logical operation on a request signal from a preceding stage and a request signal for a succeeding stage, and outputting a first or second input enable signal and a first or second clock signal; a functional block carrying out an operation on an input data according to the first or second input enable signals and the first or second clock signals from the control block, and outputting a first or second output enable signal and an output data; and a latch block triggered by an acknowledge signal from a succeeding stage, carrying out an operation on the first or second output enable signals and the output data from the functional block, and outputting a request signal for the succeeding stage and a final output data.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein:

FIGS. 14A to 14D are respective timing diagrams of operating signal states of an asynchronous pipeline according to the present invention.

DETAILED DESCRIPTION OF PREFERRED EMBODIMENTS

Figure 1:
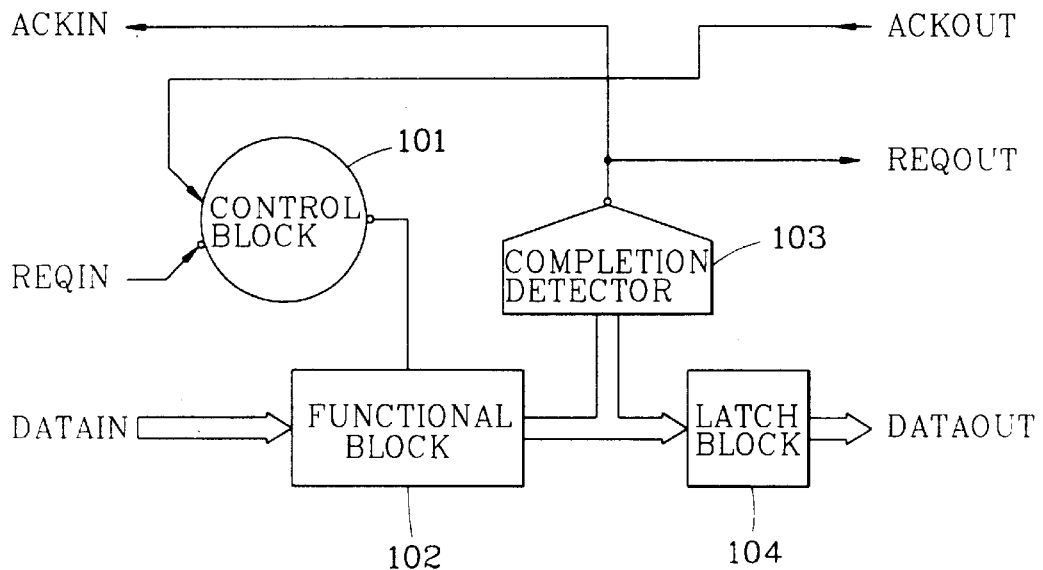
FIG. 1 is a schematic block diagram illustrating a conventional asynchronous pipeline configuration.
Figure 2:
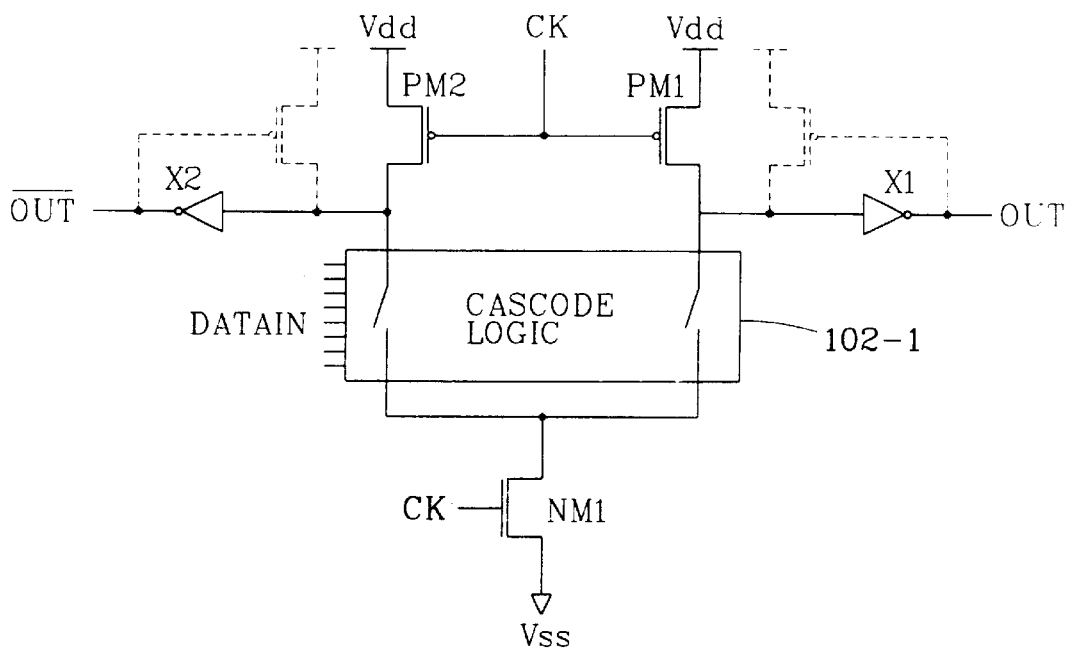
FIG. 2 is a schematic circuit diagram illustrating a first embodiment of a functional block in the configuration of FIG. 1.
Figure 3:
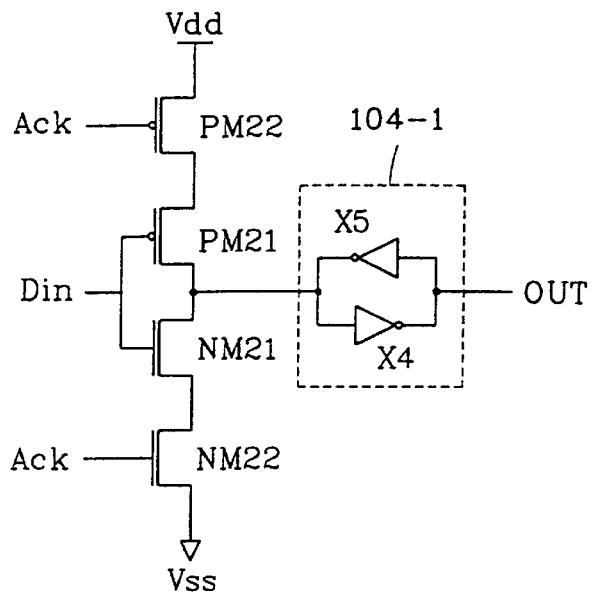
FIG. 3 is a schematic circuit diagram illustrating a latch block in the configuration of FIG. 1.
Figure 4:
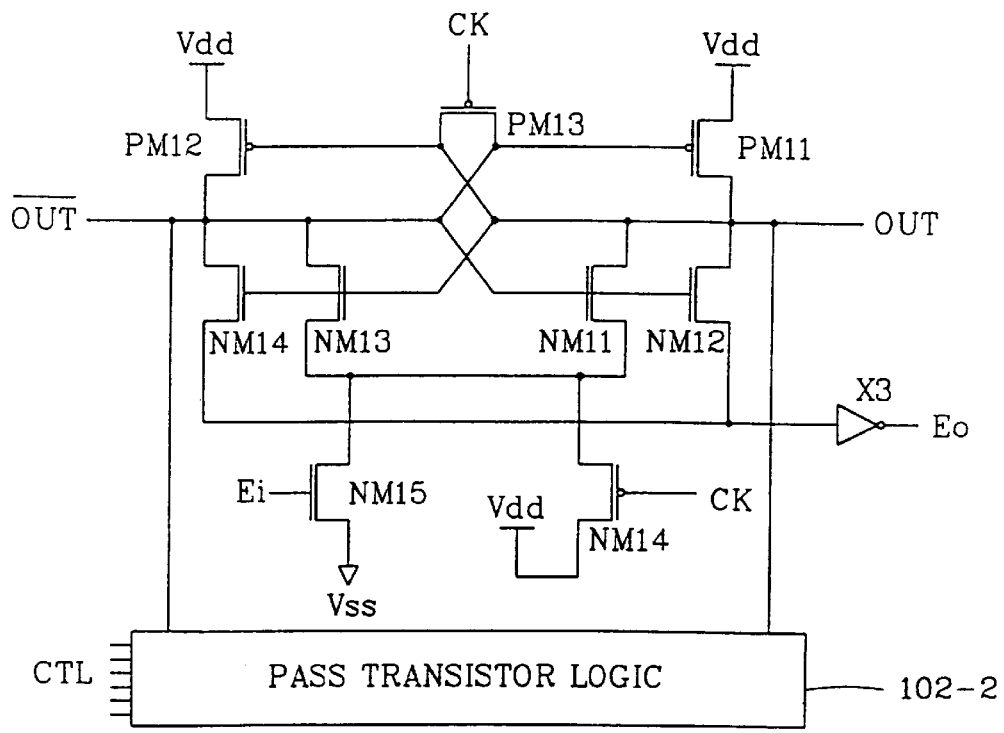
FIG. 4 is a schematic circuit diagram illustrating a first embodiment of the functional block in accordance with the present invention.
Figure 5:
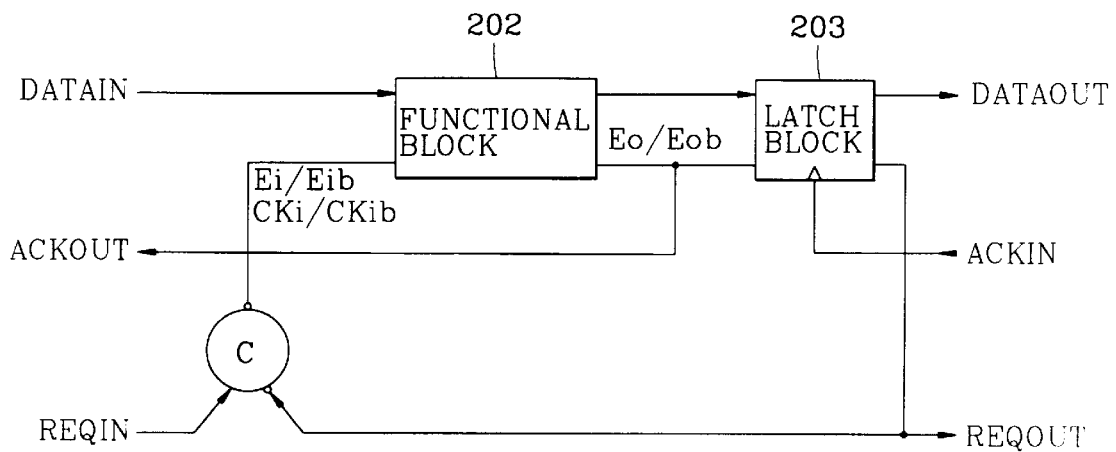
FIG. 5 is a schematic block diagram illustrating an asynchronous pipeline configuration according to the present invention.

FIG. 4 is a schematic circuit diagram illustrating an asynchronous sense differential logic (ASDL), and more particularly, a charge-recycling differential logic (CRDL) circuit for utilization of the functional block 202 in FIG. 5. As shown therein, an enable signal Ei is applied to the gate of an NMOS transistor NM15 having its source grounded. A clock signal CK is connected to the gate of a PMOS transistor PM14 to the source of which is applied a power supply voltage Vdd. A PMOS transistor PM13 to the gate of which is applied the clock signal CK has its channel connected between the respective gates of PMOS transistors PM11, PM12 to the respective sources of which is applied with the power voltage Vdd. The gates of the PMOS transistors PM11, PM13 are respectively connected to the gates of NMOS transistors NM11, NM12, the drains of NMOS transistors NM13, 14, and to an output terminal of a pass transistor logic circuit 102-2, thereby outputting respective signals OUT, $\overline{OUT}$ from respective common nodes thereof. The sources of the NMOS transistors NM11, NM13 are commonly connected to the drain of an NMOS transistor NM15. The sources of the NMOS transistors NM12, NM14 are commonly connected to the drain of the PMOS transistor PM14 and an input terminal of an inverter X3 outputting an enable signal Eo for a succeeding stage.

The pass transistor logic 102-2 is constituted to ground the output signals OUT, $\overline{OUT}$ according to a data input signal DATAIN.

If the CRDL circuit in FIG. 4 is implemented as the functional block 202, the precharge voltage of the output terminals OUT, $\overline{OUT}$ is '½Vdd' and the swing width thereof is '½Vdd'.

That is, the operation of the CRDL circuit in FIG. 4 is classified into the precharge phase and the evaluation phase.

First, in the precharge phase, when the clock signal CK is low, the PMOS transistor PM13 is turned on, and thus the output terminals OUT, $\overline{OUT}$ are connected to each other. As a result, the voltage levels of the output terminals OUT, $\overline{OUT}$ become identical according to the charge division effect.

Here, the levels of the output terminals are complementary, namely, one is always at 'Vdd' and the other is at 'Vss'. Therefore, when the output terminals are connected, the voltage level is determined between 'Vdd' and 'Vss'. In general, when the output terminals OUT, $\overline{OUT}$ are similar in an amount of parasitic capacitance, the value is determined at one-half of the power supply voltage Vdd.

In case the equalized voltage value is lower than a necessary value due to a mismatch in the parasitic capacitances, the cross-coupled PMOS transistor pair PM11, PM12 are turned on, and charges are additionally provided to a precharge node in order to render a voltage approximated to one-half of the power supply voltage Vdd.

Thereafter, the PMOS transistors PM11, PM12 with a high threshold voltage have been already turned off, and thus the output terminals OUT, $\overline{OUT}$ are not pulled up even though the necessary voltage level is obtained.

The clock signal CK is low, and thus the PMOS transistor PM14 is turned on, and the input terminal of the inverter X3 becomes high.

Accordingly, the inverter X3 outputs an enable signal E at a low level.

Then, in the evaluation phase, when the clock signal CK becomes high, the PMOS transistor PM13 is turned off, and thus the output terminals OUT, $\overline{OUT}$ are separated from each other.

Here, the pass transistor logic 102-2 receiving the data grounds one of the output terminals OUT, $\overline{OUT}$. Here, for example it is presumed that the output terminal $\overline{OUT}$ is grounded.

As a result, the output terminal OUT is maintained at a high level, and the level at the output terminal $\overline{OUT}$ becomes low.

In addition, the clock signal CK is at a high level, and thus the PMOS transistor PM14 is turned off. However, the output terminal OUT is at a high level, and thus the NMOS transistor NM14 is turned on. As a result, the level at the input terminal of the inverter X3 becomes low.

Accordingly, the enable signal Eo is changed from low to high.

That is, the greater the voltage difference between the output terminals OUT, $\overline{OUT}$ is, the faster the NMOS transistor NM14 is turned on. Therefore, the level at the input terminal of the inverter X3 becomes low. Here, the inverter X3 applied with the low signal outputs the enable signal Eo at a high level for activating an sense amplifier in the succeeding stage.

Thereafter, when the clock signal CK is changed from high to low, the data operation is carried out in the precharge state by repeating the above-described process Although the power consumption is reduced when using the CRDL, a high voltage is required in order to increase the threshold voltage Vt of the cross-coupled PMOS transistor pair.

An asynchronous sensing differential logic (ASDL) circuit according to another embodiment of the present invention will now be described in detail with reference to the accompanying drawings.

FIG. 5 is a schematic block diagram illustrating an asynchronous pipeline configuration according to the present invention. As depicted therein, the asynchronous pipeline configuration includes: a functional block 202 performing logical operations performed, having a completion detection function, and generating a completion signal for each logic operation; a control block 201 generating a signal CKi/CKib or Ei/Eib in order to control handshaking of the functional block 202 when carrying out an operation in accordance with request signals REQIN, REQOUT; and a latch block 203 storing data outputted from the functional block 202, outputting the stored data, and simultaneously outputting the request signal REQOUT for a succeeding stage.

Here, the control block 201 consists of a Muller C-element.

Various additional embodiments of the functional block 202 in accordance with the present invention are also depicted in FIGS. 6, 7, 9, 11 and 13.

Figure 6:
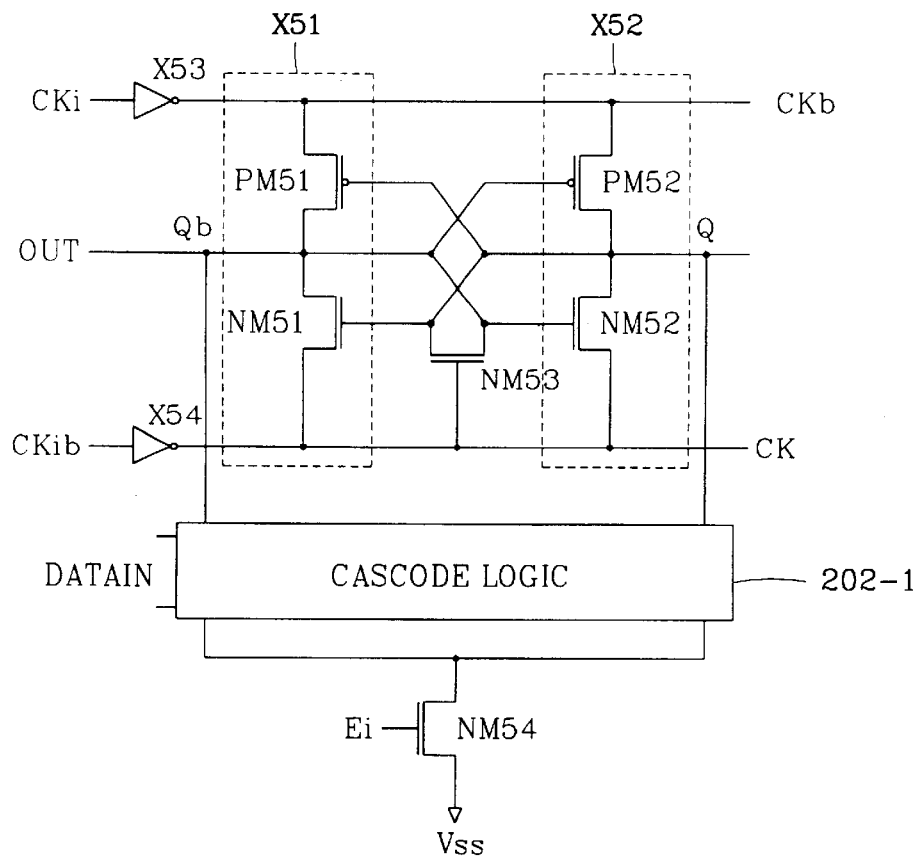
FIG. 6 is a schematic circuit diagram illustrating a functional block in the configuration of FIG. 5 according to a first embodiment of the present invention.

FIG. 6 is a schematic circuit diagram illustrating an asynchronous sense differential logic (ASDL) circuit, and more particularly, an asynchronous charge-recycling differential logic circuit, according to a first embodiment of the present invention. As shown therein, the asynchronous charge-recycling differential logic circuit includes: an inverter X53 inverting a clock signal CKi, and outputting an inverted clock signal CKb; an inverter X54 inverting an inverted clock signal CKib, and outputting a non-inverted clock signal CK; a pair of inverters X51, X52 cross-coupled between the output terminals CKb, CK of the inverters X53, X54, and respectively latching output signals Q, Qb; an NMOS transistor NM53 connected between the output terminals Q, Qb, and equalizing the output terminals Q, Qb when the output signal CK from the inverter X54 is high; a cascode logic circuit 202-1 generating a voltage difference between the output terminals Q, Qb according to an input data DATAIN; and an NMOS transistor NM54 connecting the cascode logic circuit 201-1 to ground when an enable signal Ei from the control block 201 is high.

The inverters X51, X52 are respectively constituted by connecting complementary pairs of transistors (PM51, NM51) (PM52, NM52) in series between the clock signals CKb, CK.

Figure 7:
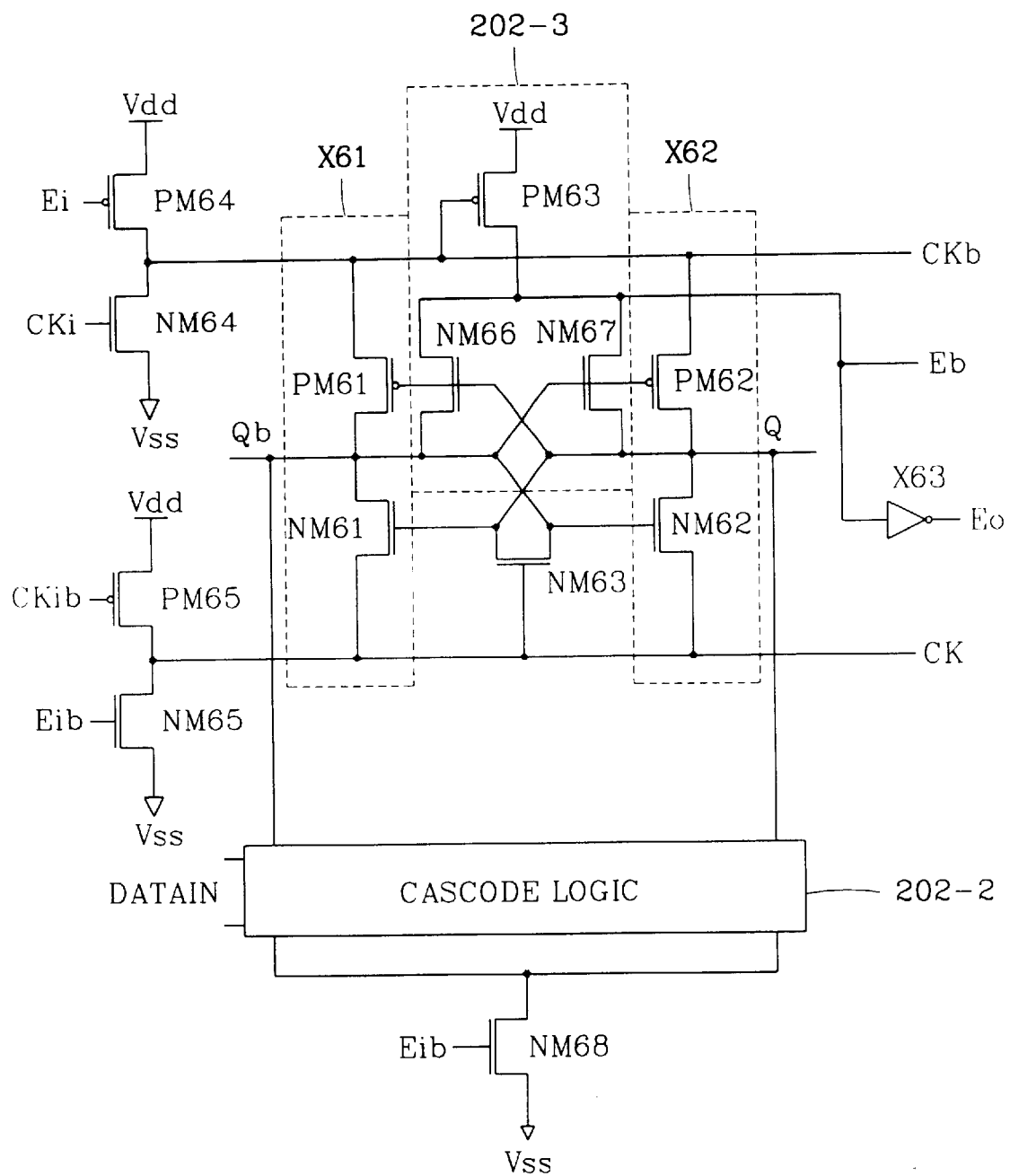
FIG. 7 is a schematic circuit diagram illustrating the functional block in the configuration of FIG. 5 according to a second embodiment of the present invention.

FIG. 7 is a schematic circuit diagram illustrating an asynchronous sense differential logic (ASDL) circuit, and more particularly, an asynchronous charge-recycling differential logic circuit, according to a second embodiment of the present invention. As shown therein, the asynchronous charge-recycling differential logic circuit includes: a inverter X64 consisting of transistors PM64, NM64 connected in series between the power supply voltage Vdd and ground voltage Vss and respectively receiving at their gates the enable signal Ei and the clock signal CKi and outputting at their drains the inverted clock signal CKb; a inverter X65 consisting of transistors PM65, NM65 connected in series between the power supply voltage Vdd and ground voltage Vss and respectively receiving at their gates the clock signal CKib and the enable signal Eib and to output the non-inverted clock signal CK; respective inverters X61, X62 cross-coupled between the clock signals CKb, CK, and respectively latching the output signals Q, Qb; an NMOS transistor 63 having its channel connected between the output terminals Q, Qb, and equalizing voltage levels of the output terminals Q, Qb when the output signal CK from the inverter X65 is high; a signal outputting unit 202-3 connected between the power supply voltage Vdd and output terminals Q, Qb, receiving the inverted clock signal CKb and the output signals Q, Qb, and outputting an enable signal Eb; an inverter X63 inverting the enable signal Eb, and outputting an enable signal Eo; a cascode logic circuit 202-2 generating a voltage difference between the output terminals Q, Qb according to the input data DATAIN; and an NMOS transistor NM68 connecting the cascode logic circuit 202-2 to ground when the enable signal Eib is high.

Here, in the signal outputting unit 202-3 the inverted clock signal CKb is applied to the gate of the PMOS transistor PM63 to the source applied of which is the power supply voltage Vdd, to the output signal Q is applied to the gate of the NMOS transistor NM66 to the source of which is applied the output signal Qb, the output signal Qb is applied to the gate of the NMOS transistor NM67 to the source of which is applied the output signal Q, and as a result the enable signal Eob is outputted from a drain common node of the transistors PM63, NM66, NM67.

The inverters X61, X62 are constituted by connecting the respective complementary pairs of transistors (PM61, NM61)(PM62, NM62) in series between the clock terminals CKb, CK, respectively.

Figure 9:
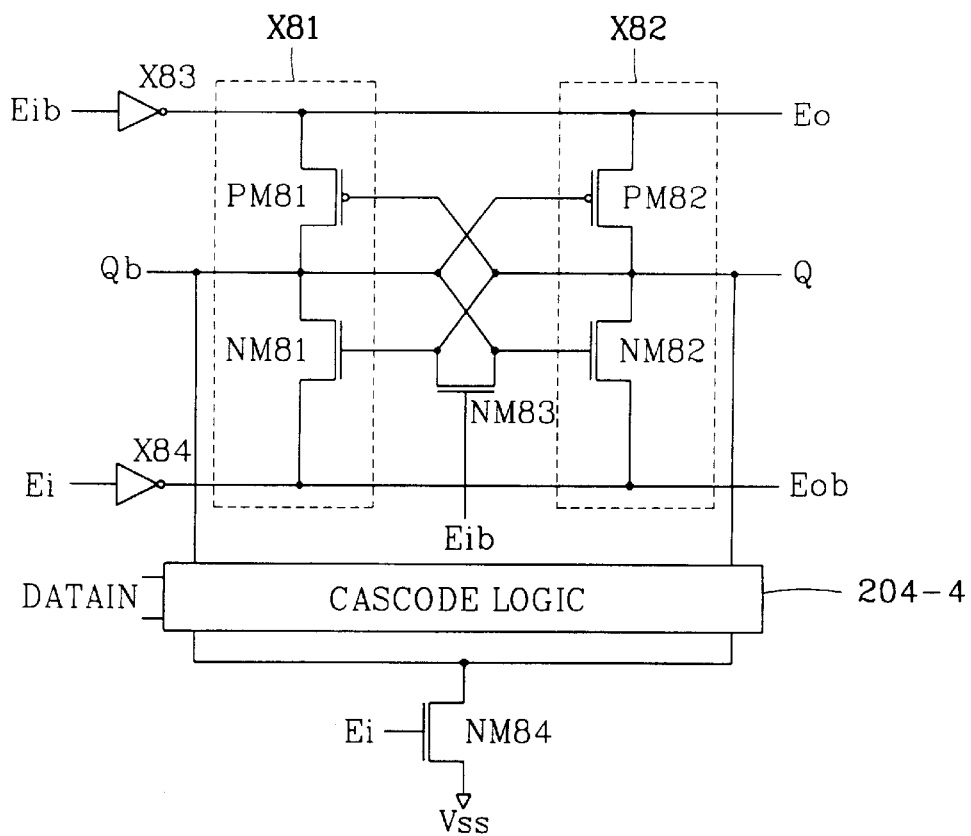
FIG. 9 is a schematic circuit diagram illustrating the functional block in the configuration of FIG. 5 according to a third embodiment of the present invention.

FIG. 9 is a schematic circuit diagram illustrating an asynchronous sense differential logic (ASDL) circuit, and more particularly, an asynchronous charge-recycling differential logic circuit, according to a third embodiment of the present invention. As illustrated therein, the asynchronous charge-recycling differential logic circuit includes: an inverter X83 inverting the inverted enable input signal Eib, and outputting the enable signal Eo; an inverter X84 inverting the non-inverted enable input signal Ei, and outputting the inverted enable signal Eob; a pair of inverters X81, X82 cross-coupled between the output terminals Eo, Eob of the inverters X83, X84, and respectively latching the output signals Q, Qb; an NMOS transistor NM83 having its channel connected between the output terminals Q, Qb, and equalizing voltage levels of the output terminals Q, Qb when the inverted enable input signal Eib applied to the gate thereof is high; a cascode logic circuit 202-4 generating a voltage difference between the output terminals Q, Qb according to the input data DATAIN; and an NMOS transistor NM84 connecting the cascode logic 202-4 to the ground when the enable input signal Ei is high.

The inverters X81, X82 are constituted by respective pairs of complementary connecting the transistors (PM81, NM81) (PM82, NM82) in series between the enable signals Eo, Eob.

Figure 11:
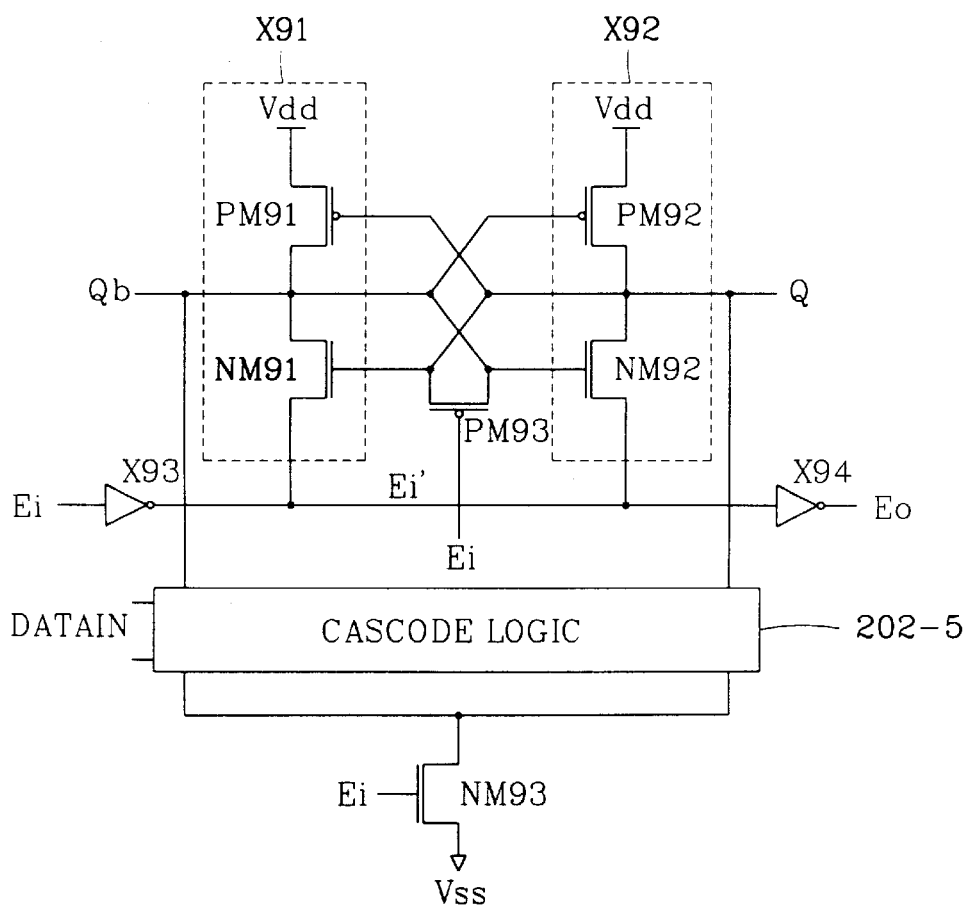
FIG. 11 is a schematic circuit diagram illustrating the functional block in the configuration of FIG. 5 according to a fourth embodiment of the present invention.

FIG. 11 is a schematic circuit diagram illustrating an asynchronous sense differential logic (ASDL) circuit, and more particularly, an asynchronous charge-recycling differential logic circuit, according to a fourth embodiment of the present invention. As illustrated in FIG. 11, the asynchronous charge-recycling differential logic circuit includes: an inverter X93 inverting the non-inverted enable input signal Ei; an inverter X94 inverting an output signal from the inverter X93, and outputting the enable signal Eo; a pair of inverters X91, X92 cross-coupled between the power supply voltage Vdd and an output terminal Ei' of the inverter X93, and respectively latching the output signals Q, Qb; a PMOS transistor PM93 having its channel connected between the output terminals Q, Qb, and equalizing voltage levels of the output terminals Q, Qb when the enable signal Ei applied to the gate thereof is low; a cascode logic circuit 202-5 generating a voltage difference between the output terminals Q, Qb according to the input data DATAIN; and an NMOS transistor NM93 connecting the cascode logic circuit 202-5 to ground when the enable signal Ei is high.

The inverters X91, X92 are constituted respective complementary pairs of by connecting the transistors (PM91, NM91)(PM92, NM92) in series between the power supply voltage Vdd and the enable input signal Ei'.

Figure 13:
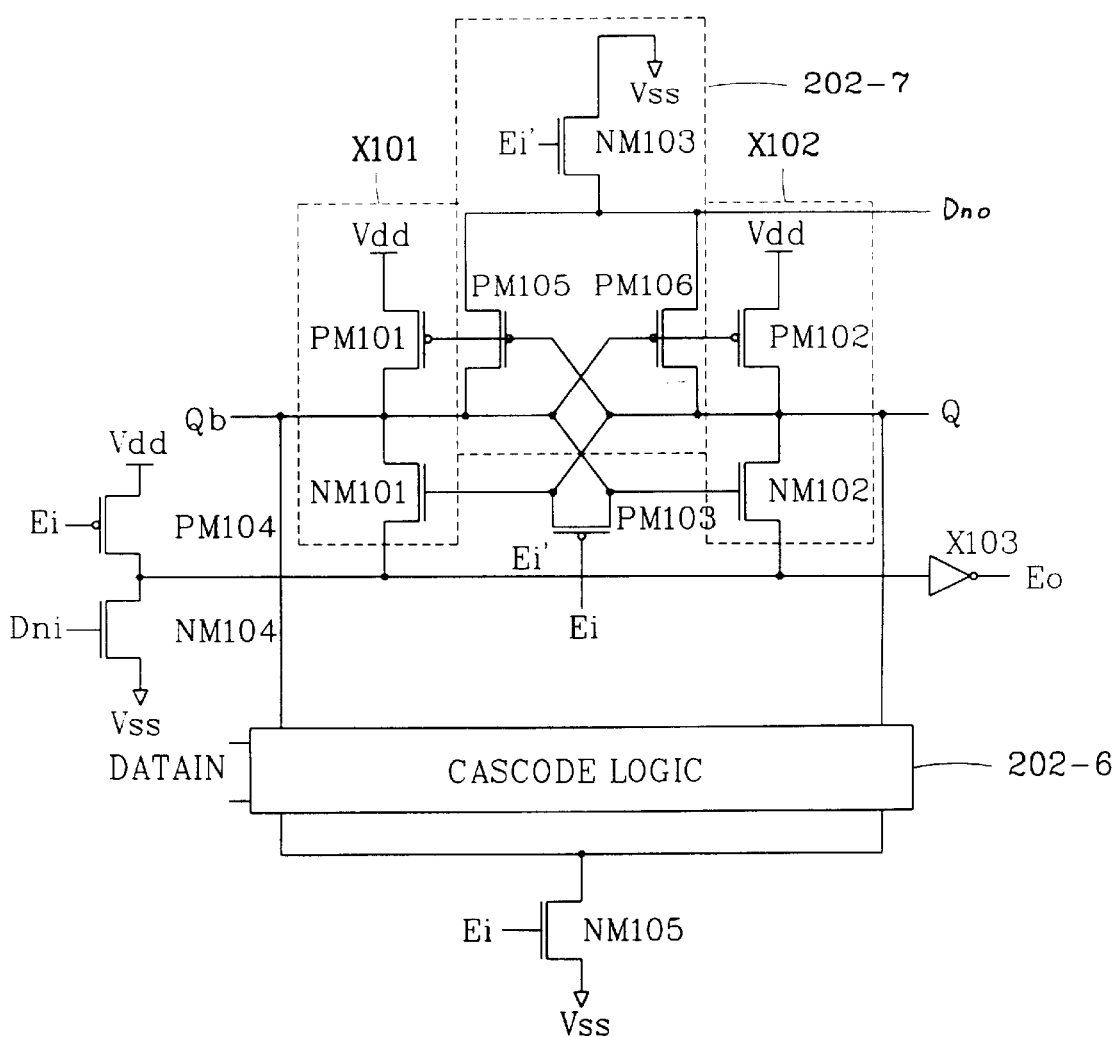
FIG. 13 is a schematic circuit diagram illustrating the functional block in the configuration of FIG. 5 according to a fifth embodiment of the present invention.

FIG. 13 is a schematic circuit diagram illustrating an asynchronous sense differential logic (ASDL) circuit, and more particularly, an asynchronous charge-recycling differential logic circuit, according to a fifth embodiment of the present invention. As shown therein, the asynchronous charge-recycling differential logic circuit includes: a inverter constituted by transistors PM104, NM104 connected in series between the power supply voltage Vdd and the ground voltage Vss and receiving at their respective gates the enable input signal Ei and an operation completion signal Dni from a preceding stage and outputting the enable signal Ei'; an inverter X103 inverting the enable signal Ei', and outputting the enable signal Eo; respective inverters X101, X102 cross-coupled between the power supply voltage Vdd and the enable signal Ei, and respectively latching the output signals Q, Qb; a PMOS transistor PM103 having its channel connected between the output terminals Q, Qb, and equalizing the output terminals Q, Qb when the enable input signal Ei is low; a signal outputting unit 202-7 connected between ground and the output terminals Q, Qb, receiving the enable signal E' and the output signals Q, Qb, and outputting an operation completion signal Dno; a cascode logic circuit 202-6 outputting a data signal to the output terminals Q, Qb according to a variable data input DATAIN; and an NMOS transistor NM105 connecting the cascode logic circuit 202-6 to ground when the enable input signal Ei is high.

Here, in the signal outputting unit 202-7 the enable input signal Ei is applied to the gate of an NMOS transistor NM103 having its source grounded, to the output signal Q is applied to the gate of a PMOS transistor 105 to the source of which is applied the output signal Qb, and the output signal Qb is applied to the gate of a PMOS transistor PM106 to the source of which is applied the output signal Q, and thus the operation completion signal Dno is outputted from the common drain node of the transistors NM103, PM105, PM106.

The inverters X101, X102 are constituted by connecting respective complementary pairs of transistors (PM101, NM101)(PM102, NM102) in series between the power supply voltage Vdd and the enable signal Ei'.

Figure 8:
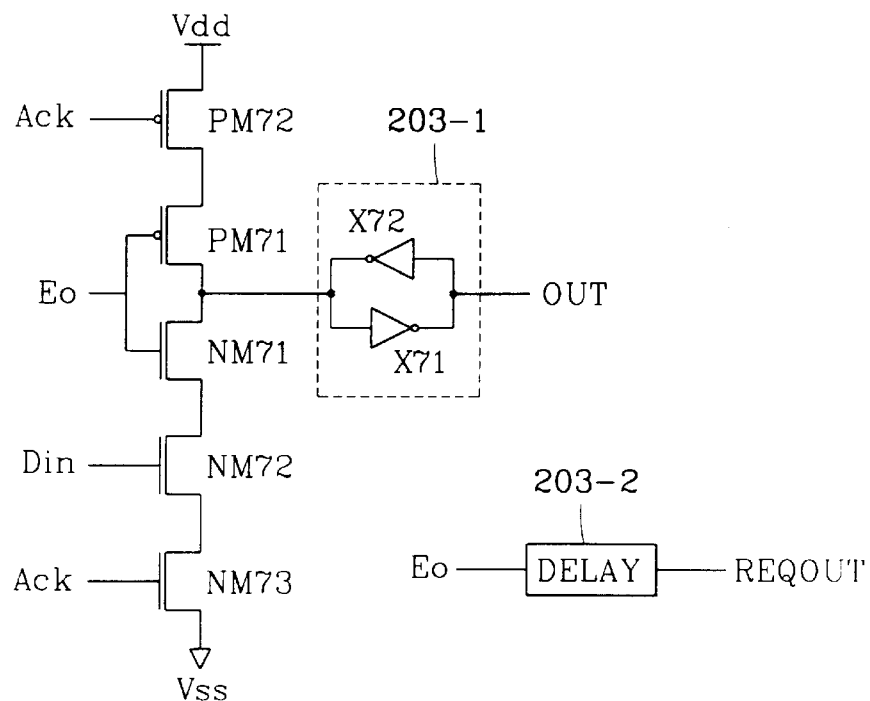
FIG. 8 is a schematic circuit diagram illustrating a latch block in the configuration of FIG. 5 according to the present invention.

As illustrated in FIG. 8, in the latch block 203 an acknowledge signal ACKIN is, applied to the gate of a PMOS transistor PM72 having its source connected to the power supply voltage Vdd, and also applied to the gate of an NMOS transistor NM72 having its source grounded. An input data signal Din, namely an output signal OUT or $\overline{\text{OUT}}$ from the functional block 202 is applied to the gate of an NMOS transistor NM73 having its source connected to the drain of the NMOS transistor NM72, and the enable signal Eo from the functional block 202 is applied to the gate of a PMOS transistor PM71 having its source connected to the drain of the PMOS transistor PM72 and also applied to the gate of an NMOS transistor NM71 having its source connected to the drain of the NMOS transistor NM73. The common drain node of the transistors PM71, NM71 is connected to the input terminal of a latch 203-1 wherein a pair of inverters X72, X71 are parallel-reverse-connected for outputting the output signal OUT, and a delay circuit 203-2 is provided for delaying the output signal Eo from the functional block 202 and thereby generating the request signal REQOUT for the succeeding stage.

The operation and effects of the asynchronous pipeline configuration according to the present invention will now be described with reference to FIGS. 14A to 14D.

In a state where the request signal REQOUT for the succeeding stage is at a low level, when the request signal REQIN from the preceding stage is at a high level, the output signal CKi or Ei from the control block 201 becomes high. As a result, the functional block 202 enters into an evaluation phase, evaluates an output value, and generates the enable signal Eo at a high level.

Here, the enable signal Eo is outputted as an acknowledge signal ACKOUT for the preceding stage.

Thereafter, the latch block 203 carries out an operation on the output data from the functional block 202, delays the enable signal Eo for a predetermined time, and generates the request signal REQOUT for the succeeding stage, thereby communicating the operation completion of the latch phase.

Here, when the request signal REQOUT for the succeeding stage is at a high level and a predetermined time elapses, the output signal CKi or Ei from the control block 201 becomes low, and the functional block 202 is returned to the precharge phase.

Accordingly, the output terminals Q, Qb of the functional block 202 are equalized to '½Vdd', and the functional block 202 outputs the enable signal Eo at a low level after a predetermined time elapses.

That is, the asynchronous system having the pipeline configuration according to the present invention carries out the data operation by repeating the above-described process according to the timing as illustrated in FIGS. 14A to 14D. As a result, the latch block 203 latches the data outputted from the functional block 202, and transmits the data to the succeeding stage.

On the other hand, the data from the functional block 202 is transmitted to the succeeding stage through the latch block 203 including the transistors PM71, PM72, NM71–NM73, the latch 203-1 and the delay circuit 203-2, as illustrated in FIG. 8.

That is, when the acknowledge signal ACKIN and the enable signal Eo are at a low level, a high-level signal is applied to the latch 203-1, and thus the output data signal DATAOUT is outputted at a low level. In a state where the acknowledge signal ACKIN and the enable signal Eo are at a high level, when the input data signal Din becomes high, a low-level signal is applied to the latch 203-1, and thus the preceding low level state of the output data signal DATAOUT is maintained.

In the case that the acknowledge signal ACKIN and the enable signal are at different levels, the latch 203-1 maintains the preceding output level.

The delay circuit 203-2 receiving the enable signal Eo delays the enable signal Eo for a predetermined time, and outputs the request signal REQOUT for the succeeding stage.

In addition, the functional block 202 consists of the asynchronous charge-recycling differential logic circuit. The operation of the functional block 202 according to the embodiments of the present invention will now be explained.

The operation of the functional block 202 according to the first embodiment of the present invention implementing the circuit as shown in FIG. 6 will be firstly described.

In a state where the enable signal Ei from the control block 201 is at a low level, when the clock signal CKi is at a high level and the clock signal CKib is at a low level, the functional block 202 is put into the precharge phase. The high-level clock signal CKi is inverted by the inverter X53, and thus outputted as the low-level clock signal CKb. The low-level clock signal CKib is inverted by the inverter X54, and thus outputted as the high-level clock signal CK.

Therefore, the clock signals CK, CKb are respectively at a high and low level, and thus the cross-coupled inverters X51, X52 maintain an off state in regard to the output terminals Q, Qb. The NMOS transistor NM53 which is an equalization transistor is turned on by the high-level clock signal CK, and thus the voltage levels of the output terminals Q, Qb are precharged to '½Vdd'.

Here, in a state where the enable signal Ei from the control block 201 is at a high level and the NMOS transistor NM54 is thus turned on, the cascode logic circuit 202-1 generates a voltage difference between the output terminals Q, Qb by performing a logical operation on the input data DATAIN. It is presumed that the output terminal Q is at a high level.

Thereafter, when the clock signal CKi is changed from high to low, and the clock signal CKib is changed from low to high, the functional block 202 is put into the evaluation phase. The inverter X53 inverts the low-level clock signal CKi, and outputs the high-level clock signal CKb. The inverter X54 inverts the high-level clock signal CKib, and outputs the low-level clock signal CK.

Accordingly, the inverters X51, X52 are enabled, and thus evaluate a data value of the output terminals Q, Qb at a high speed. As it is presumed above that the output terminal Q is at a high level, the PMOS transistor PM51 is turned off, the NMOS transistor NM51 is turned on, and thus the inverter X51 pulls down the output terminal Qb to a low level. In addition, the PMOS transistor PM52 is turned on, the NMOS transistor NM52 is turned off, and thus the inverter X52 pulls up the output terminal Q to a high level.

The respective levels of the output terminals Q, Qb are transmitted to the succeeding stage according to the above operation, and the clock signals CK, CKb are also transmitted as the clock signals CKi, CKib to the succeeding stage.

Thereafter, when the clock signal CKi is changed from low to high and the clock signal CKib is changed from high to low, the functional block 202 is returned to the precharge phase. As a result, the high-level clock signal CKi is inverted by the inverter X53, and outputted as the low-level clock signal CKb. In addition, the low-level clock signal CKib is inverted by the inverter X54, and outputted as the high-level clock signal CK.

As the clock signals CK, CKb are respectively at a high and low level, the cross-coupled inverters X51, X52 are turned off in regard to the output terminals Q, Qb, and the NMOS transistor NM53 is turned on in response to the high-level clock signal CK, thereby connecting the output terminals Q, Qb. As a result, the output terminals Q, Qb are precharged to '½Vdd'.

That is to say, in accordance with the change in the level of the clock signals CKi, CKib, the precharge phase and the evaluation phase are repeatedly carried out, and thus the input data are sequentially transmitted to the succeeding stage.

The first embodiment of the present invention is very effective when operation of a stage of the functional block 202 is delayed only for a short time.

The operation of the functional block 202 implementing the circuit of FIG. 7 according to the second embodiment of the present invention will now be described with reference to FIG. 7.

The circuit in FIG. 7 is extremely similar in operation to the circuit in FIG. 6, except for the enable timing of the cross-coupled inverters X61, X62.

In the case of the circuit in FIG. 7, in a state where the clock signal CKi is changed to a high level, the crossed-coupled inverters X61, X62 of a current terminal are not enabled until the operation of the preceding stage is completed and the enable input signal Ei becomes active.

In the asynchronous charge-recycling differential logic circuit according to the second embodiment of the present invention, when operation of a stage of the functional block 202 is delayed for relatively long time, a disadvantage resulting from pre-evaluation may be overcome. The operation thereof will now be explained in detail.

When the clock signal CKi is at a high level and the clock signal CKib is at a low level, the enable input signal Ei is at a high level, the input enable signal Eib is at a low level, and the inverters X61, X62 are disabled.

Here, the NMOS transistor NM64 is turned on by the high-level clock signal CKi, and the clock terminal CKb is at a low level. The PMOS transistor PM65 is turned on by the low-level clock signal CKib, and the clock terminal CK is at a high level.

The clock signals CKb, CK are respectively at a low and high level, and thus the cross-coupled inverters X61, X62 are maintained in an off state. The NMOS transistor NM63 is turned on by the high-level clock signal CK, and the output terminals Q, Qb are precharged to '½Vdd'.

The clock signal CKb is at a low level, and thus in the signal outputting unit 202-3, the PMOS transistor PM63 is turned on, and outputs the enable signal Eb at a high level. The inverter X63 applied with the high-level enable signal Eob outputs the enable input signal Eo at a low level.

Thereafter, when the clock signal CKi is changed from high to low and the clock signal CKib is changed from low to high, if the enable input signal Ei is changed from high to low and the input enable signal Eib is changed from low to high, the NMOS transistor NM64 and the PMOS transistor PM65 are each thereby turned off, and the PMOS transistor PM64 and the NMOS transistor NM65 are each thereby turned on.

Accordingly, the inverted clock signal CKb is at a high level, and the non-inverted clock signal CK is at a low level. As a result, the cross-coupled inverters X61, X62 are put into an operating state in regard to the output terminals Q, Qb.

Here, in a state where the NMOS transistor NM68 is turned on by the input enable signal Eib applied to the gate thereof, the cascode logic circuit 202-2 generates a voltage difference between the output terminals Q, Qb in accordance with the input data DATAIN. Here, for example it is presumed that the output terminal Q is at a high level.

Accordingly, the PMOS transistor PM61 is turned off and the NMOS transistor 61 is turned on by the applied high-level signal of the output terminal Q. Therefore, the inverter X61 pulls down the level of the output terminal Qb at a high speed. On the other hand, the PMOS transistor PM62 is turned on and the NMOS transistor NM62 is turned off by the applied low-level of the output terminal Qb. As a result, the inverter X62 pulls up the level of the output terminal Q at a high speed.

Here, in the signal outputting unit 202-3, the PMOS transistor PM63 is turned off by the applied high-level clock signal CKb. However, it is presumed in the above example that the output terminal Q is at a high level, and thus the NMOS transistor NM66 is turned on thereby and the enable signal Eb becomes low.

Accordingly, the inverter X63 inverts the enable signal Eob which is at a low level, and thus the enable signal Eo becomes high.

Then, when the clock signal CKi is changed from low to high and the clock signal CKib is changed from high to low, if the input enable signal Ei is transited from low to high and the input enable signal Eib is transited from high to low, the cross-coupled inverters X61, X62 are disabled, the NMOS transistor NM63 is turned on, and thus the output terminals Q, Qb are precharged again to '½Vdd'.

The above-described operation is repeatedly carried out whenever the levels of the signals Ei/Eib, CKi/CKib generated from the control block 201 are changed.

The operation and effects of the functional block 202 implementing the circuit shown in FIG. 9 according to the third embodiment of the present invention will now be described.

When the inverted input enable signal Eib is at a high level and the non-inverted input enable signal Ei is at a low level, in an equalization phase, the high-level input enable signal Eib is inverted by the inverter X83 and outputted as the low-level enable signal Eo, and the low-level input enable signal Ei is inverted by the inverter X84 and outputted as the high-level enable signal Eob.

Accordingly, the enable signals Eo, Eob are respectively at a low and high level, and thus the cross-coupled inverters X81, X82 are maintained in an off state in regard to the output terminals Q, Qb. The NMOS transistor NM83 which is the equalization transistor is turned on by the applied high-level input enable signal Eib, thereby precharging the voltage levels of the output terminals Q, Qb to '½Vdd'.

Thereafter, when the input enable signal Eib is changed from high to low and the input enable signal Ei is changed from low to high, the enable signal Eo is changed to high, the enable signal Eob is changed to low, and thus a sensing/evaluation phase starts.

Here, in a state where the NMOS transistor NM83 is turned off by the applied low-level input enable signal Eib and the NMOS transistor NM84 is turned on by the applied high level input enable signal Ei, the cascode logic circuit 202-4 carries out a logical operation on the input data, thereby generating a voltage difference between the output terminals Q, Qb. Here, for example it is presumed that the output terminal Qb is discharged to ground, and thus becomes low.

Accordingly, the inverters X81, X82 evaluate the voltage difference between the output terminals Q, Qb at a high speed. It is presumed in the above example that the level of the output terminal Q is high. Therefore, the PMOS transistor PM81 is turned off, the NMOS transistor NM81 is turned on, and thus the inverter X81 pulls down the output terminal Qb to a low level. In addition, the PMOS transistor PM82 is turned on, the NMOS transistor NM82 is turned off, and thus the inverter X82 pulls up the output terminal Q to a high level.

The levels of the output terminals Q, Qb are transmitted to the succeeding stage in accordance with the above-described operation. The enable signals Eo, Eob are also transmitted as input enable signals Ei, Eib of the next-succeeding stage.

Thereafter, the input enable signal Ei is changed from high to low, the enable signal Eib is changed from low to high, and thus the equalization phase starts. Here, the inverter X83 inverts the high-level input enable signal Eib and outputs the low-level input enable signal Eo, and the inverter X84 inverts the low-level enable signal Ei and outputs the high-level enable signal Eob.

Accordingly, the enable signals Eob, Eo are respectively at a high and low level, and thus the cross-coupled inverters X81, X82 are put into an off state. The NMOS transistor NM83 is turned on by the high-level input enable signal Eib, and connects the output terminals Q, Qb. As a result, the output terminals Q, Qb are precharged to '½Vdd'.

That is, in accordance with the change in level of the input enable signals Ei, Eib, the equalization phase and sensing/evaluation phase are repeatedly exchanged, and thus the input data DATAIN is sequentially transmitted into the succeeding stage.

Figure 10:
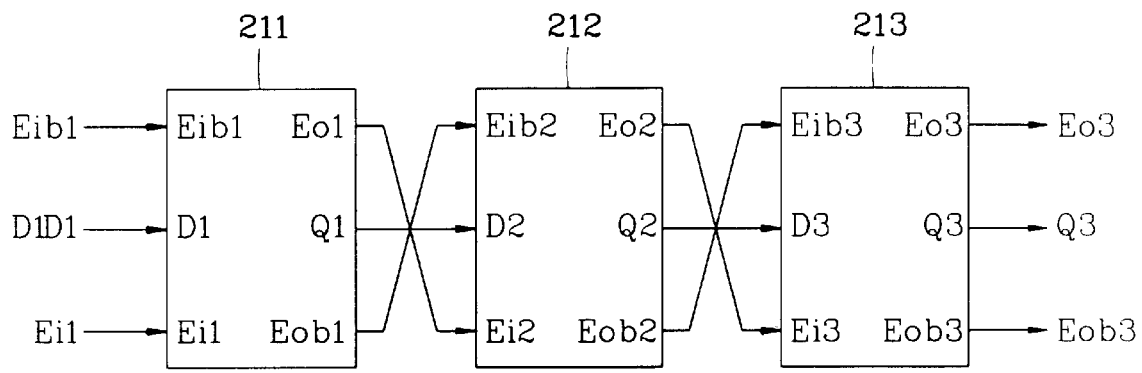
FIG. 10 is a schematic block diagram illustrating a three-bit chain connection configuration employing the functional block circuit in FIG. 9.

As shown in FIG. 10, a three-bit chain connection configuration of functional blocks may be embodied by serially connecting the functional block circuits 211–213 each implementing the circuit shown in FIG. 9 performing the above-described operation.

The operation and effects of the functional block 202 implementing the circuit shown in FIG. 11 according to the fourth embodiment of the present invention will now be explained.

The input enable signal Ei is at a low level and in the evaluation phase. The inverters X93, X94 sequentially invert the low-level input enable signal Ei and output the low-level enable signal Eo.

Here, the output signal Ei' from the inverter X93 is at a high level, and thus the inverters X91, X92 cross-coupled in regard to the output terminals Q, Qb and composing a pull up/down circuit are put into an off state. The PMOS transistor PM93 is turned on by the low-level input enable signal Ei, thereby precharging the levels of the output terminals Q, Qb '½Vdd'.

The respective PMOS transistors PM91, PM92 of the CMIS inverters X91, X92 are connected directly to the power supply voltage Vdd, and thus the precharge level is lightly higher in this circuit than in the circuit in FIG. 9.

Thereafter, when the input enable signal Ei is changed from low to high, the sensing/evaluation phase starts.

Here, in a state where the PMOS transistor PM93 is turned off and the NMOS transistor NM93 is turned on by the applied high-level enable signal Ei, the cascode logical circuit 202-5 carries out a logical operation on the data DATAIN, thereby generating a voltage difference between the output terminals Q, Qb. Here, for example it is presumed that the output terminal Qb is discharged to ground and becomes low.

Therefore, the inverters X91, X92 evaluate the voltage difference between the output terminals Q, Qb at a high speed. It is presumed in the above example that the level of the output terminal Q is high. Accordingly, the PMOS transistor PM91 is turned off, the NMOS transistor NM91 is turned on, and thus the inverter X91 pulls down the output terminal Qb to a low level. In addition, the PMOS transistor PM92 is turned on, the NMOS transistor NM92 is turned off, and thus the inverter X92 pulls up the output terminal Q to a high level.

According to the operation described above, the levels of the output terminals Q, Qb are transmitted into the next-succeeding stage. The enable signal Eo is also transmitted as the input enable signal Ei of the succeeding stage.

Thereafter, the input enable signal Ei is changed from high to low, and the evaluation phase starts. Here, the inverters X93, X94 sequentially invert the low-level input enable signal Ei, and output the low-level enable signal Eo.

Accordingly, the enable signal Eo is at a low level, and the cross-coupled inverters X91, X92 are disabled. The PMOS transistor PM93 is turned on by the applied low-level input enable signal Ei, and connects the output terminals Q, Qb. As a result, the output terminals Q, Qb are precharged to approximately '½Vdd'.

That is, as the level of the input enable signal Ei changes, the equalization phase and the sensing/evaluation phase are repeatedly exchanged, thereby sequentially transmitting the input data DATAIN to the next-succeeding stage.

Figure 12:
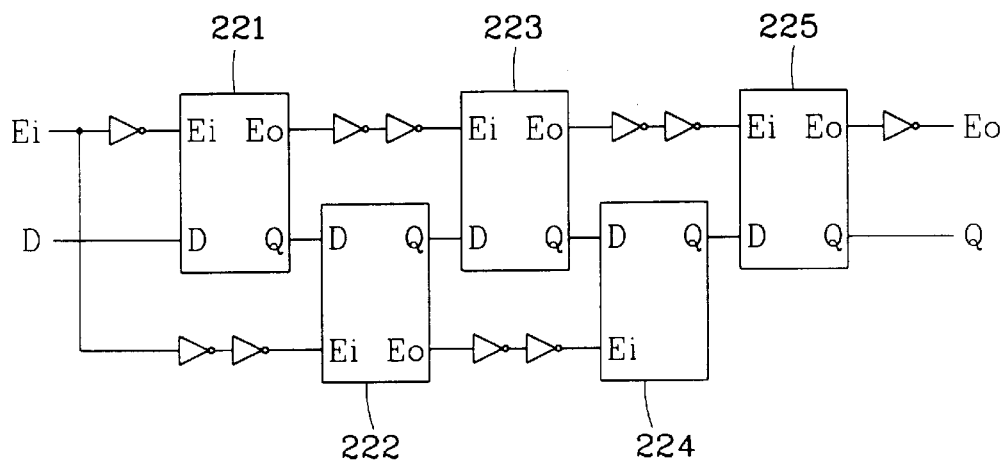
FIG. 12 is a schematic block diagram illustrating a five-bit chain connection configuration employing the functional block circuit in FIG. 11.

As shown in FIG. 12, a five-bit connection chain configuration of functional blocks may be embodied by serially connecting the data terminals of the functional block circuits 221–225 each implementing the circuit shown in FIG. 11 for carrying out the above-described operation. In this case, the input enable signal Ei has a predetermined delay time, and is transmitted into a stage after a next stage. For example, the input enable signal Eo of the circuit 221 is inputted as the enable signal Ei of the circuit 223 through a delay circuit composed for example of a pair of inverters in series. Consequently, the enable signal Eo and the data signal Q are obtained.

Finally, the operation and effects of the functional block 202 implementing the circuit shown in FIG. 13 according to the fifth embodiment of the present invention will now be described.

When the input enable signal Ei is at a low level, and the operation completion signal Dni from the preceding stage is at a low level, and thus the equalization phase starts, the PMOS transistor PM104 is thereby turned on, the enable signal Ei' thereby becomes high, and thus the inverters X101, X102 are in an off state.

Here, the enable signal Ei' is at a high level, and thus in the signal outputting unit 202-7, the NMOS transistor NM103 is thereby turned on, and outputs the operation completion signal Dno at a low level. The inverter X103 receiving the high-level enable signal Ei' outputs the enable signal Eo at a low level.

The PMOS transistor PM103 is turned on by the applied low-level input enable signal Ei, and thus the output terminals Q, Qb are precharged to '½Vdd'.

Thereafter, when the input enable signal Ei is transited from low to high, the PMOS transistors PM103, PM104 are turned off, the output terminals Q, Qb are disconnected from one another, and the enable signal Ei' is in a high impedance state.

Here, in a state where the NMOS transistor NM105 is turned on by the applied high-level enable signal Ei, the cascode logic circuit 202-6 generates a voltage difference between the output terminals Q, Qb by performing an operation on the input data DATAIN. Here, for example it is presumed that the output terminal Q becomes high.

When the operation completion signal Dni from the preceding stage is changed to high, the NMOS transistor NM104 is thereby turned on, and the enable signal Ei' becomes low. As a result, the cross-coupled inverters X101, X102 are operated, the inverter X103 inverts the low-level enable signal Ei', and thus the enable signal Eo becomes high.

Therefore, in accordance with the high-level of the output terminal Q, the PMOS transistor PM101 is turned off, the NMOS transistor NM101 is turned on, and thus the inverter X101 pulls up the level of the output terminal Qb at a high speed. In accordance with the low-level of the output terminal Qb, the PMOS transistor PM 102 is turned on, the NMOS transistor NM102 is turned off, and thus the inverter X102 pulls up the level of the output terminal Q at a high speed.

In addition, in the signal outputting unit 202-7, because the enable signal Ei' is at a low level, the NMOS transistor NM103 is thereby turned off. However, the output terminal Q is at a high level, the output terminal Qb is at a low level, and thus the PMOS transistor PM106 is turned on, thereby outputting the operation completion signal Dno at a high level.

Thereafter, when the input enable signal Ei is transited from high to low, if the operation completion signal Dni from the preceding stage is changed from high to low, the PMOS transistor PM104 is thereby turned on, and thus the enable signal Ei' becomes high. Accordingly, the cross-coupled inverters X101, X102 are disabled, and the PMOS transistor PM103 is turned on, thereby again precharging the output terminals Q, Qb again to '½Vdd'.

The above-described operation is repeatedly carried out whenever the level of the input enable signal Ei transmitted from the control block 201 to the functional block 202 is transited.

The cascode logic circuits 202-1, 202-2, 202-4, 202-5, 202-6 in accordance with the above-described embodiments of the present invention may be replaced by a complementary output pass transistor logic network that generates a data at the output terminals Q, Qb in accordance with a variable data input.

As discussed earlier, differently from the synchronous system, the asynchronous system of the present invention does not employ a global clock signal, and thus does not suffer a clock skew problem. In addition, the asynchronous system of the present invention carries out a communication between the blocks by employing local control signals, which results in the reduction of the clock distribution.

When the conventional differential cascode voltage switch (DCVS) logic is used, power is significantly consumed. However, the asynchronous system of the present invention has a power-efficient operation characteristic, thus reducing power consumption.

According to the present invention, it is not necessary to control a threshold voltage of the PMOS transistors of the cross-coupled inverter pairs. Therefore, a high voltage is not required for controlling the threshold voltage, which results in a high-speed process consuming only a small amount of power. In addition, it is easy to apply the asynchronous configuration of the present invention to the digital design, which reduces cost.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are therefore intended to be embraced by the appended claims.

The foregoing embodiments are merely exemplary and are not to be construed as limiting the present invention. The present teaching can be readily applied to other types of apparatuses. For example, the various embodiments of FIGS. 4, 6, 7, 9, 11 and 13 can be applied to synchronous systems. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A sensing differential logic circuit comprising:
   a control block for carrying out a logical operation on a request signal from a preceding stage and a request signal for a succeeding stage, and for outputting a first or second input enable signal and a first or second clock signal in accordance therewith;
   a functional block for carrying out an operation on an input data in accordance with the first or second input enable signal and the first or second clock signal from the control block, and for outputting a first or second output enable signal and an output data; and
   a latch block triggered by an acknowledge signal from the succeeding stage, and outputting the request signal for the succeeding stage and a final output data by carrying out an operation on the first or second output enable signal and the output data from the functional block.

2. The circuit according to claim 1, wherein the first input enable signal is of opposite phase to the second input enable signal.

3. The circuit according to claim 1, wherein the first clock signal is contrary in phase to the second clock signal.

4. The circuit according to claim 1, wherein the first output enable signal is contrary in phase to the second output enable signal.

5. The circuit according to claim 1, wherein the functional block comprises:
   first and second output nodes;
   an equalization transistor for equalizing levels of the first and second output nodes;
   a pull-up/pull-down circuit for pulling up/pulling down a voltage of the first and second output nodes;

an enable inverter for determining an operation phase, and for activating/deactivating the equalization transistor and the pull-up/pull-down circuit; and a complementary output pass-transistor logic network.

6. The circuit according to claim 5, wherein the complementary output pass transistor logic network is replaced by a cascode logic circuit.

7. The circuit according to claim 5, wherein the pull-up/pull-down circuit comprises:

a pull-up circuit including first and second PMOS transistors that are cross-coupled; and a pull-down circuit including first and second NMOS transistors that are cross-coupled.

8. The circuit according to claim 1, wherein the functional block comprises:

first and second output nodes;

a first inverter for inverting the first clock signal from the control block, and for outputting a third clock signal;

a second inverter for inverting the second clock signal from the control block, and for outputting a fourth clock signal;

a first transistor having its source connected to receive the third clock signal, its drain connected to the first output node, and its gate connected to the second output node;

a second transistor having its source connected to receive the third clock signal, its drain connected to the second output node, and its gate connected to the first output node;

a third transistor having its source connected to receive the fourth clock signal, its drain connected to the first output node, and its gate connected to the second output node;

a fourth transistor having its source connected to receive the fourth clock signal, its drain connected to the second output node, and its gate connected to the first output node;

a fifth transistor having its source and drain respectively connected to the respective gate electrodes of the third and fourth transistors, and respectively alternately connected to the first and second output nodes, and with its gate connected to receive the fourth clock signal;

a cascode logic circuit for initializing the first and second output nodes in accordance with the input data; and a sixth transistor for grounding an internal switching element of the cascode logic circuit in accordance with the first input enable signal from the control block.

9. The circuit according to claim 8, wherein the functional block further comprises an output enable signal generating unit connected between a power supply voltage and the first and second output nodes, receiving the third clock signal and respective voltages of the first and second output nodes, and outputting the first and second output enable signals at respective first and second output enable signal output terminals.

10. The circuit according to claim 9, wherein the output enable signal generating unit comprises:

a seventh transistor having its source connected to receive the power supply voltage, its drain connected to the first output enable signal output terminal, and its gate connected to receive the third clock signal; and eighth and ninth transistors having their drains commonly connected to the drain of the seventh transistor and also connected to the first output enable signal output terminal, their respective sources connected to the first and second output nodes, respectively, and their respective gates alternately connected to the first and second output nodes.

11. The circuit according to claim 8, wherein the first inverter comprises:

a PMOS transistor having its source connected to receive a power supply voltage, and its gate connected to receive the first input enable signal; and an NMOS transistor having its source connected to receive a ground voltage, its drain connected to a drain of the PMOS transistor, and its gate connected to receive the first clock signal.

12. The circuit according to claim 8, wherein the second inverter comprises:

a PMOS transistor having its source connected to receive a power supply voltage, and its gate connected to receive the second clock signal; and an NMOS transistor having its drain connected to the drain of the PMOS transistor, its gate connected to receive the second input enable signal, and its source connected to receive a ground voltage.

13. The circuit according to claim 8, wherein the cascode logic circuit is replaced by a pass-transistor logic network for transmitting a data to the first and second output nodes in accordance with a variable data input.

14. The circuit according to claim 1, wherein the functional block comprises:

first and second output nodes;

a first inverter for inverting the first input enable signal from the control block, and for outputting a first output enable signal;

a second inverter for inverting the second input enable signal from the control block, and for outputting a second output enable signal;

a first transistor having its source connected to receive the first output enable signal, its drain connected to the first output node, and its gate connected to the second output node;

a second transistor having its source connected to receive the first output enable signal, its drain connected to the second output node, and its gate connected to the first output node;

a third transistor having its source connected to receive the second output enable signal, its drain connected to the first output node, and its gate connected to the second output node;

a fourth transistor having its source connected to receive the second output enable signal, its drain connected to the second output node, and its gate connected to the first output node;

a fifth transistor having its source and drain respectively connected to the gate electrodes of the third and fourth transistors, and respectively alternately connected to the first and second output nodes, and having its gate connected to receive the second input enable signal from the control block;

a cascode logic circuit for initializing the first and second output nodes in accordance with the input data; and a sixth transistor for grounding an internal switching element of the cascode logic circuit in accordance with the first input enable signal from the control block.

15. The circuit according to claim 14, wherein the cascode logic circuit is replaced by a pass-transistor logic network for generating data to the first and second output nodes in accordance with a variable data input.

16. The circuit according to claim 1, wherein the functional block comprises:

first and second output nodes;

a first inverter for inverting the first input enable signal from the control block, and for outputting an inverted enable signal;

a second inverter for re-inverting the inverted enable signal, and for outputting an output enable signal;

a first transistor having its source connected to receive the power supply voltage, its drain connected to the first output node, and its gate connected to the second output node;

a second transistor having its source connected to receive the power supply voltage, its drain connected to the second output node, and its gate connected to the first output node;

a third transistor having its source connected to receive the inverted enable signal from the first inverter, its drain connected to the first output node, and its gate connected to the second output node;

a fourth transistor having its source connected to receive the inverted enable signal from the first inverter, its drain connected to the second output node, and its gate connected to the first output node;

a fifth transistor having its source and drain respectively connected to the respective gate electrodes of the third and fourth transistors, and respectively alternately connected to the first and second output nodes, and having its gate connected to receive the first input enable signal from the control block;

a cascode logic circuit for initializing the first and second output nodes in accordance with the input data; and a sixth transistor for grounding an internal switching element of the cascode logic circuit in accordance with the first input enable signal.

17. The circuit according to claim 16, wherein the functional block further comprises an operation completion signal generating unit connected between the first and second output nodes, receiving respective voltages of the first and second output nodes, and outputting a data output completion signal for a succeeding stage.

18. The circuit according to claim 17, wherein the operation completion signal generating unit comprises:

a seventh transistor having its source connected to receive a ground voltage, its drain connected to the operation completion signal output terminal, and its gate connected to receive the inverted signal of the first enable signal; and eighth and ninth transistors having their drains respectively connected to the drain electrode of the seventh transistor and also connected to the operation completion signal output terminal, and having their respective sources connected to the first and second output nodes, respectively, and their respective gates connected alternately to the first and second output nodes.

19. The circuit according to claim 16, wherein the first inverter comprises:

a PMOS transistor having its source connected to receive the power supply voltage, and its gate connected to receive the first input enable signal; and an NMOS transistor having its drain connected to a drain of the PMOS transistor and outputting the inverted enable signal, its source connected to receive the ground voltage, and its gate connected to receive an operation completion signal from a preceding stage.

20. The circuit according to claim 16, wherein the cascode logic circuit is replaced by a pass-transistor logic network for generating data signals to the first and second output nodes in accordance with a variable data input.

21. The circuit according to claim 1, wherein the latch block comprises:

a data input unit including first to fifth transistors connected in series between a power supply voltage and a ground voltage, receiving the acknowledge signal at gate electrodes of the first and fifth transistors, receiving the output enable signal at gates of the second and third transistors, and receiving the output data from the functional block at a gate of the fourth transistor;

a latch unit having its input terminal connected to a common node of the second and third transistors in the data input unit, and for latching a signal input thereto; and a delay unit for delaying the output enable signal, and generating the request signal for the succeeding stage.

* * * * *